United States Patent [19]

Sato et al.

[11] 4,346,322

[45] Aug. 24, 1982

[54] ELASTIC SURFACE WAVE DEVICE

[75] Inventors: Kouji Sato, Yokohama; Sadao Takahashi, Tokyo; Toshikazu Kodama, Yokohama, all of Japan

[73] Assignee: Tokyo Shibaura Denki Kabushiki Kaisha, Kawasaki, Japan

[21] Appl. No.: 131,538

[22] Filed: Mar. 18, 1980

[30] Foreign Application Priority Data

Mar. 22, 1979 [JP] Japan ................................. 54/32245

[51] Int. Cl.³ ............................................. H03H 9/00
[52] U.S. Cl. ............................. 310/313 B; 310/313 C
[58] Field of Search ........... 310/313 R, 313 B, 313 C, 310/313 D; 333/150, 151, 153, 154

[56] References Cited

U.S. PATENT DOCUMENTS

| | | | |
|---|---|---|---|
| 3,699,364 | 10/1972 | Gerard | 310/313 B |
| 3,748,603 | 7/1973 | Wojcik | 310/313 B |
| 3,845,418 | 10/1974 | Weglein | 310/313 B |
| 3,908,137 | 9/1975 | Hunsinger | 310/313 D |
| 3,952,269 | 4/1976 | Bristol | 310/313 D |
| 4,025,880 | 5/1977 | Coussot | 310/313 C |
| 4,065,789 | 12/1977 | De Vries | 310/313 D |
| 4,166,257 | 8/1979 | Subramanian | 310/313 C |

FOREIGN PATENT DOCUMENTS

| | | |
|---|---|---|
| 50-145048 | 5/1974 | Japan . |
| 1430725 | 4/1976 | United Kingdom . |
| 1512686 | 6/1978 | United Kingdom . |

*Primary Examiner*—Mark O. Budd
*Attorney, Agent, or Firm*—Oblon, Fisher, Spivak, McClelland & Maier

[57] ABSTRACT

An elastic surface wave device comprises an input transducer and an output transducer, these transducers being provided on one surface of a piezoelectric substrate and spaced apart a predetermined distance from each other. The input transducer is provided on its side facing the output transducer with at least one separate comb electrode which is electrically insulated from the rest of the input transducer.

6 Claims, 8 Drawing Figures

ELASTIC SURFACE WAVE DEVICE

This invention relates to an elastic surface wave device having an effective spurious component suppressing function.

Hitherto, elastic surface wave devices each having at least one transducer consisting of interdigital electrodes formed on a piezoelectric substrate have been used. As the interdigital electrodes of the transducer, first and second comb electrodes are arranged to face each other such that their finger electrode portions interdigitate. Usually, these interdigital electrodes have a predetermined amplitude-weighted pattern character with respect to the overlap-length of the interdigitated portions of the finger electrode portions and the position thereof in the direction of propagation of surface waves. With the transducer having the interdigital electrodes of such an amplitude-weighted pattern character, however, the speed of propagation of the surface wave along the area where finger electrode portions interdigitate is slow compared to that along the area where finger electrode portions do not interdigitate in the direction of surface wave propagation, and this causes distortion of the wave front of the surface wave.

Figure 1:
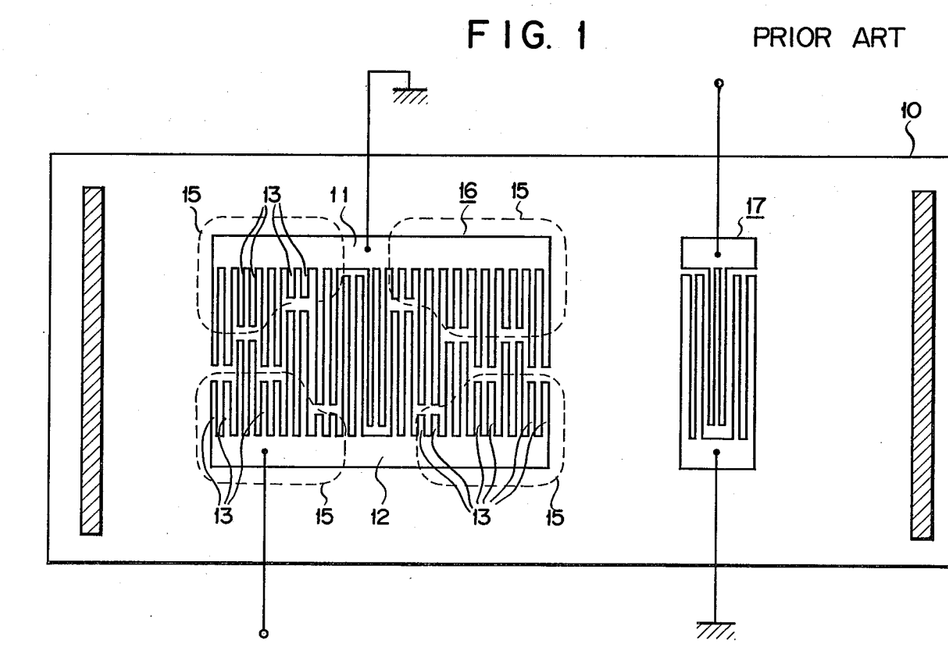
FIG. 1 is a schematic plan view showing an example of the prior-art elastic surface wave device.

To overcome this drawback, an elastic surface wave device provided with dummy electrodes for compensation for the wave front distortion has been proposed, as disclosed in U.S. Pat. No. 3,699,364. This proposed device has a structure as shown in FIG. 1, with first and second comb electrodes 11 and 12 formed on a piezoelectric substrate 10 such that they face each other with their finger electrode portions interdigitating one another. The first and second comb electrodes 11 and 12 have gap portions formed in areas where finger electrodes do not interdigitate, and within these gap portions dummy electrodes 13 are formed integrally with the comb electrodes 11 and 12. With this arrangement, the electrode density in the direction of surface wave propagation is substantially made equal for the amplitude-weighted interdigital electrode portion and the portion provided with the dummy electrodes 13, so that the wave front of the propagating surface wave is not distorted.

Figure 2:
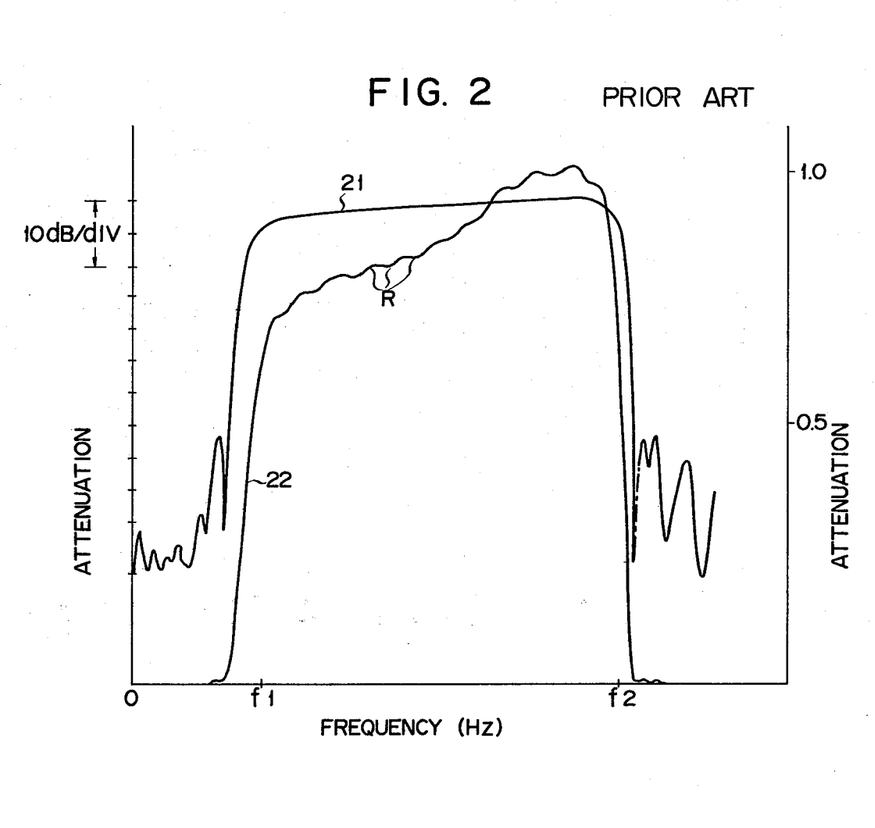
FIG. 2 is a graph showing frequency characteristics of the device of FIG. 1.

However, such an elastic wave device having the dummy electrodes 13 has a drawback in that its output signal contains a spurious component to a great extent. FIG. 2 shows frequency characteristic curves of the elastic surface wave device shown in FIG. 1, the output attenuation of the elastic surface wave device with the frequency is plotted on the decibel scale in curve 21 and on the linear scale in curve 22. As is seen from the linear scale frequency characteristic curve 22, with the elastic surface wave device having dummy electrodes, great ripple R is produced within a passband frequency range (between $f_1$ and $f_2$), and this ripple R appears as the spurious component in the output of the elastic surface wave device.

As a result of investigations conducted by the inventors, it was found that the cause of generation of the spurious component is attributable to the influence of bulk waves produced to propagate through the thickness direction of the substrate 10 between a comb electrode portion not contributing to the generation of the surface wave, that is, areas enclosed by broken lines 15 in FIG. 1, and a grounded electrode (not shown) provided on the back side of the piezoelectric substrate 10 and also bulk waves due to an electric field produced due to the electromagnetic coupling between the areas 15 where finger electrodes do not interdigitate and an output transducer 17.

The influence of these bulk waves can be generally reduced by sufficiently spacing apart the input and output transducers 16 and 17 and also by reducing the thickness of the piezoelectric substrate 10. However, by increasing the distance between the input and output transducers the propagation loss of the surface wave is increased, as well as increasing the area of the piezoelectric substrate to increase the cost thereof. Also, by making the piezoelectric substrate thin the mechanical strength thereof is reduced so that breakage of the substrate is likely to occur during the manufacturing process, that is, the substrate cannot be made thinner than a certain extent.

It may be thought to solve the problem of the spurious component by removing that portions of the comb electrodes which do not contribute to the generation of the surface wave and constitute a cause for the generation of bulk waves. Doing so, however, leads to distortion of the wave front of the surface wave, thus greatly disturbing the pass band characteristics, and is thus undesired.

An object of the invention is to provide an elastic surface wave device, which is free from distortion of the wave front of propagated surface waves and can suppress the spurious component stemming from bulk waves as well as being small in size and capable of ensuring satisfactory yield of manufacture.

According to the invention, the above object is achieved by an elastic surface wave device comprising, in combination:

a piezoelectric substrate;

at least one electromechanical transducer provided on one surface of said substrate;

said transducer comprising first and second comb electrodes with finger electrodes of the first comb electrode interdigitating with finger electrodes of the second comb electrode in a desired overlap length weighting fashion for forming therein an overlap region and non-overlap region; and at least one compensation electrode constituted of at least a predetermined portion of the non-overlap region electrically insulated from the overlap region.

This invention can be more fully understood from the following detailed description when taken in conjunction with the accompanying drawings, in which.

Figure 3:
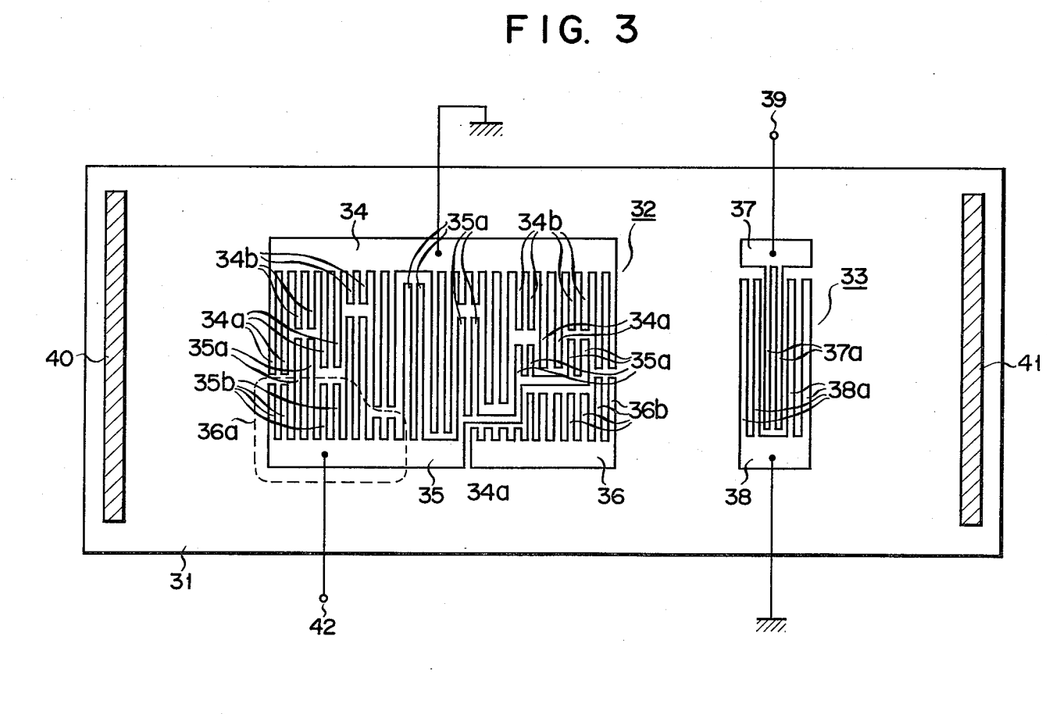
FIG. 3 is a schematic plan view showing an embodiment of the elastic surface wave device according to the invention.

Referring now to FIG. 3, reference numeral 31 designates a piezoelectric substrate made of a piezoelectric material such as lithium tantalate ($LiTaO_3$) or lithium niobate ($LiNbO_3$). On one surface of the piezoelectric substrate 31 input and output transducers 32 and 33 are provided at a predetermined spacing in the longitudinal direction of the substrate 31, that is, in the direction of surface wave propagation. The input transducer 32 includes first and second comb electrodes 34 and 35. A separate comb electrode 36 insulated from the first and second comb electrodes 34 and 35 is further provided on the surface of the substrate 31. The comb electrodes 34 and 35 respectively have a plurality of interdigitated finger electrodes 34a and 35a having predetermined interdigitated lengths determined according to a desired weighting pattern and also non-interdigitating finger electrodes 34b and 35b. The finger electrodes 34a, 34b of the first comb electrode 34 are commonly connected to the ground. The finger electrodes 35a, 35b of the second comb electrode 35 are connected commonly and further connected to an input terminal 42. The separate comb electrode 36 has a plurality of non-interdigitating finger electrodes 36b. The separate comb electrode 36 is electrically floated from the other electrodes.

The output transducer 33 includes first and second comb electrodes 37 and 38 disposed such that their respective finger electrodes 37a and 38a have substantially an equal length sufficiently deeply interdigitated with one another. The finger electrodes 37a of the first comb electrode 37 are connected commonly to an output terminal 39, and the finger electrodes 38a of the second comb electrode 38 are commonly connected to the ground. In the following embodiments, all the finger electrodes of the comb electrodes 34, 35, 36, 37 and 38 are formed as split finger electrodes, each consisting of two divisions extending side by side in their width direction, in order to reduce the spurious component due to the reflected surface waves stemming from the difference in the acoustic impedance between the finger electrodes and gap portions between adjacent finger electrodes.

The surface of the piezoelectric substrate 31 is provided adjacent to its opposite ends in the longitudinal direction, that is, the direction of surface wave propagation with surface wave absorbers 40 and 41 for suppressing the spurious component stemming from the reflection of a surface wave at the opposite ends.

In FIG. 3, the input signal is supplied across the input terminal 42 and the ground, namely, between the first and second comb electrodes 34 and 35 of the input transducer 32. With the impression of the input signal an elastic surface wave is produced on the surface of the piezoelectric substrate 31. The elastic surface wave thus produced propagates along the surface of the piezoelectric substrate 31 to reach the output transducer 33. The output transducer 33 converts the incident surface wave into an electric signal, which is taken out from between the output terminal 39 and the ground.

In the input transducer 32, only the interdigitated portion of the finger electrodes 34a, 35a of the first and second comb electrodes 34 and 35 contributes to the generation of the surface wave. The non-interdigitating finger electrodes 34b, 35b are, if applied with an input signal, a cause for the generation of bulk waves. Thus, in the embodiment of FIG. 3, the finger electrode portions 36b facing the output transducer 33, which do not contribute to the generation of the surface wave are electrically isolated from shortened finger electrode portions 35a which contribute to the generation of the surface wave such that the input signal is only applied to the shortened portions 35a and is not supplied to the separate comb electrode 36.

With the construction of FIG. 3, no electric field is set up between the separate comb electrode 36 and a grounded electrode (not shown) formed on the opposite surface of the piezoelectric substrate 31. Thus, practically no spurious component due to bulk wave between these two electrodes appears. Besides, the separate comb electrode 36 also effectively functions to compensate the wave front phase of the surface wave produced from the input transducer 32 so that the wave front will not be distorted.

The second comb electrode 35 also has a portion not contributing to the generation of the surface wave, i.e., a portion enclosed by a broken line 36a. This portion 36a, however, is spaced apart from the output transducer 33 by a greater distance, so that magnitudes of bulk waves stemming from this portion are not so considerable. From this ground, in the embodiment of FIG. 3 only the separate comb electrode 36 is insulated from the second comb electrode 35. The first comb electrode 34 is grounded, so that no electric field is produced between this electrode 34 and a grounded electrode (not shown) provided on the opposite surface of the piezoelectric substrate 31, thus causing generation of no bulk wave. From this ground, the first comb electrode 34 may not take a form similar to that of the second comb electrode 35 incorporating the separate comb electrode 36.

Figure 4:
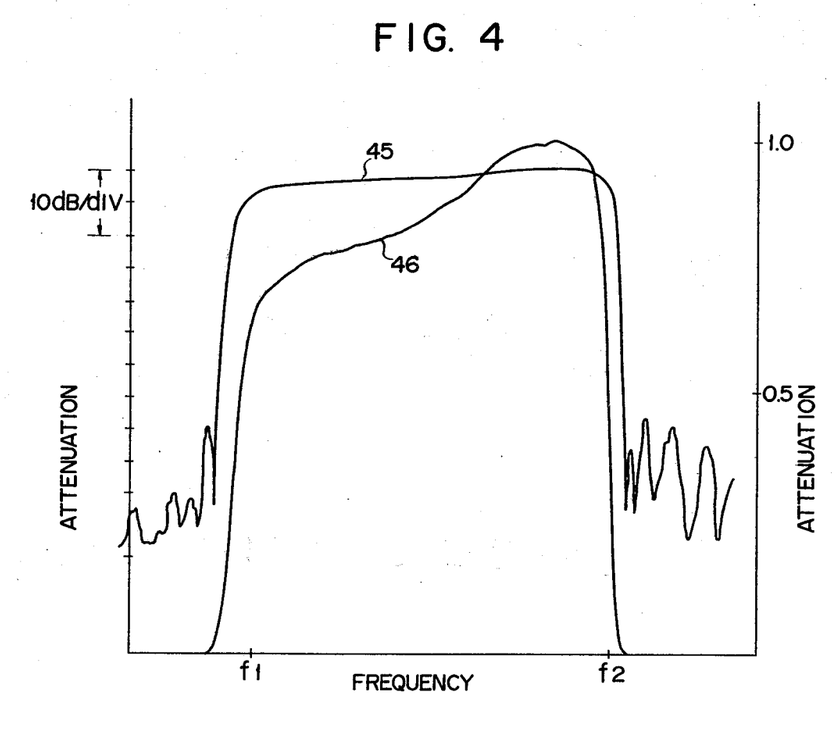
FIG. 4 is a graph showing frequency characteristics of the device of FIG. 3.

FIG. 4 shows the frequency characteristics of the elastic surface wave device of the construction embodying the invention as shown in FIG. 3; the output attenuation with the frequency is plotted on the decibel scale in curve 45 and on the linear scale in curve 46. The ripple in the curve 46 within the passband frequency range (between $f_1$ and $f_2$), giving rise to the spurious component, is extremely reduced compared to the curve 22 in FIG. 2 for the prior-art elastic surface wave device, and this effect is outstanding.

FIGS. 5 to 8 show other embodiments of the invention. In these Figures, parts corresponding to those in FIG. 3 are designated by like reference numerals.

Figure 5:
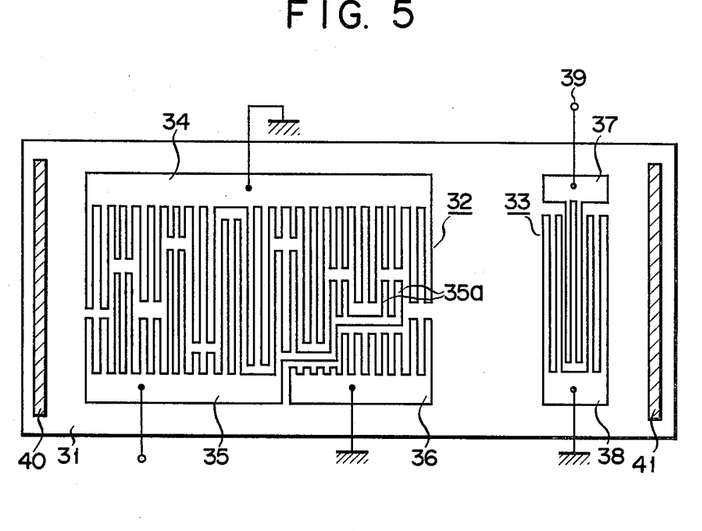
FIGS. 5 to 8 are schematic plan views showing other embodiments of the invention.

The embodiment of FIG. 5 has the same electrode construction as the preceding embodiment of FIG. 3 except that its separate comb electrode 36 is grounded. Grounding the separate comb electrode 36 in this way has an effect of suppressing the direct electromagnetic coupling between the signal input electrode terminal 42 of the input transducer 32 and the signal output electrode terminal 39 of the output transducer 33.

Figure 6:
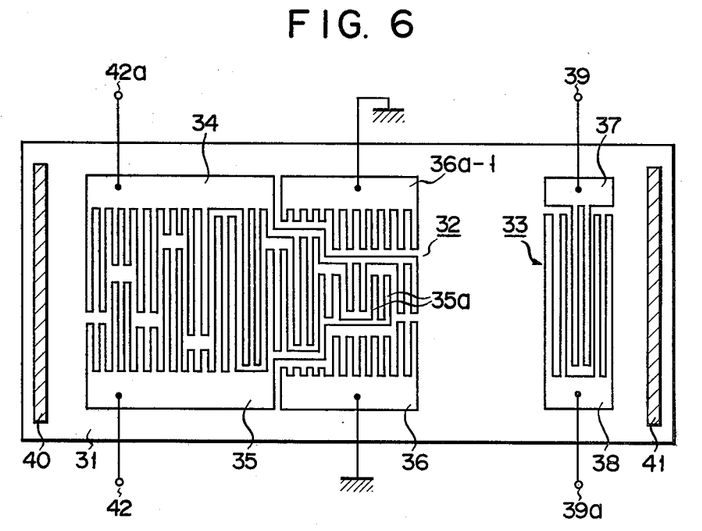

In the embodiment of FIG. 6, the electrode structure according to the invention is applied not only to the second comb electrode 35 but also to the first comb electrode 34. More particularly, a portion of the comb electrode 34 not contributing to the generation of the surface wave is constituted by a separate comb electrode 36a-1 which is insulated from the rest of the electrode 34 and grounded. The first and second comb electrodes 34 and 35 of the input transducer 32 are connected to respective terminals 42a and 42, and the first and second comb electrodes 37 and 38 of the output transducer 33 are connected to respective terminals 39 and 39a.

With this construction, it is possible to ground the terminal 42, that is, the second comb electrode 35 and apply the input signal to the input terminal 42a, that is, the first comb electrode 34 or, conversely, ground the first comb electrode 34 and apply the input signal to the second comb electrode 35. This means that the signal input terminal may be selected from the two terminals 42a and 42, which is convenient from the standpoint of the circuit design in case when connecting the elastic surface wave device according to the invention in another circuit.

Figure 7:
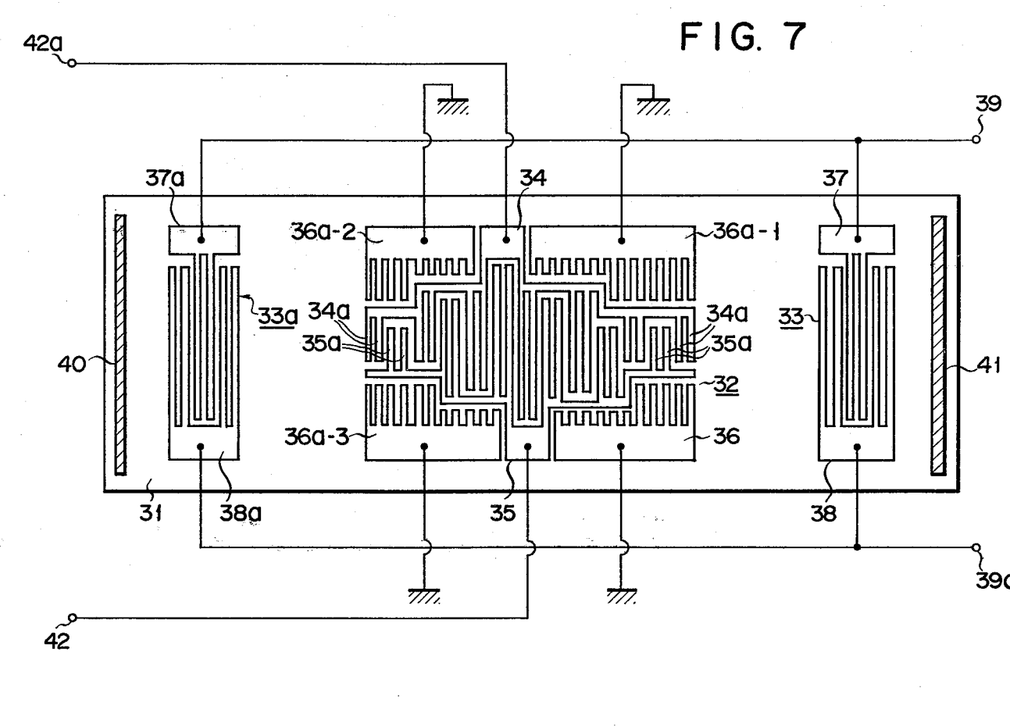

In the embodiment of FIG. 7, the electrode structure according to the invention is applied to all the electrode portions of the first and second comb electrodes 34 and 35 which do not contribute to the generation of the surface wave. This arrangement is suited in case when constructing a so-called three-transducer type elastic surface wave device having two output transducers 33 and 33a provided on the opposite sides of the input transducer 32 as is shown. In FIG. 7, portions of the first comb electrode 34 which do not contribute to the generation of the surface wave are constituted by respective two separate comb electrodes 36a-1 and 36a-2 which are grounded. Likewise, portions of the second comb electrode 35 not contributing to the generation of the surface wave are constituted by respective two separate comb electrodes 36 and 36a-3 which are also grounded.

With the elastic surface wave device of this construction, by coupling an input signal through the terminals 42 and 42a to the input transducer 32 the surface wave produced therefrom is propagated along the surface of the piezoelectric substrate 31 to reach the two output transducers 33 and 33a. At this time, since the separate comb electrodes 36, 36a-1, 36a-2 and 36a-3 which do not contribute to the generation of the surface wave are all grounded, no bulk waves are produced between these electrodes and a grounded electrode (not shown) provided on the opposite surface of the substrate 31 or between these electrodes and output transducers 33 and 33a, so that an output free from any spurious component can be obtained from both the output transducers 33 and 33a.

Figure 8:
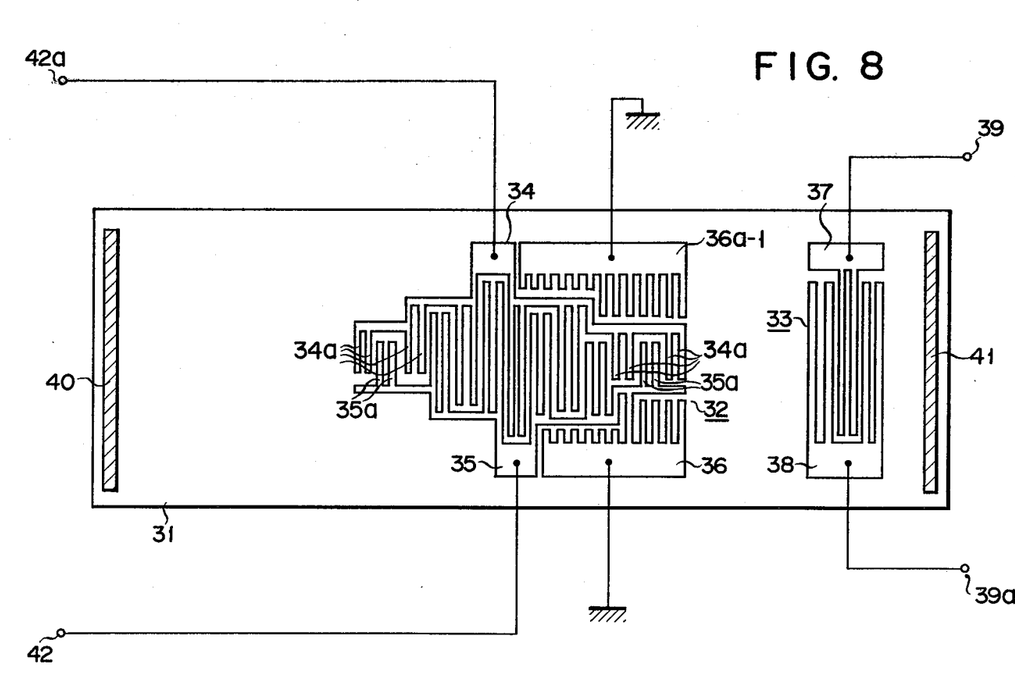

The embodiment of FIG. 8 is obtained by removing the output transducer 33a and also the separate comb electrodes 36a-2 and 36a-3 on the side facing the removal transducer 33a in the embodiment of FIG. 7.

In this embodiment, the electrode area of the first and second transducers 34 and 35 of the input transducer 32 is reduced compared to that in the embodiment of FIG. 6, and this means a corresponding reduction of the transducer capacity. Thus, it is possible to reduce the electric Q of the input transducer 32 or, in other words, it is possible to increase the impedance of the transducer 32.

While the preceding embodiments have adopted the split structure for the finger electrodes, this is by no means limitative, and the invention may of course be applied to the case adopting the ordinary finger electrode structure as well. Also, while the above embodiments have all employed dummy electrodes for eliminating the distortion of the wave front of the surface wave, the invention may also be applied to the elastic surface wave devices where a weighted electrode pattern is provided without using any dummy electrode.

Further, since according to the invention not only the surface wave propagation loss is small but also the loss due to bulk waves is small, the invention may be effectively applied to an elastic surface wave device where the influence of bulk wave is pronounced, for instance one using an X-axis cut $LiTaO_3$ piezoelectric substrate and with the direction of the surface wave propagation set to be at an angle of 75° to 133° with respect to the Y-axis or one using a rotated 128° Y-axis cut $LiNbO_3$ piezoelectric substrate and with the direction of the surface wave propagation set parallel to the X-axis, and in this case an elastic surface wave device having very satisfactory characteristics and presenting very little spurious component can be obtained.

In the described embodiments of FIGS. 3, 5, 6, 7 and 8, the transducer 32 is used as an input transducer and the transducer 33 is used as an output transducer. As is well-known in the art, however, the transducer 33 may be used as an input transducer and the transducer 32 may be used as an output transducer.

What we claim is:

1. An elastic surface wave device comprising, in combination:
    a piezoelectric substrate;
    at least one electromechanical transducer provided on one surface of the substrate;
    said transducer comprising first and second comb electrodes each having respective finger electrodes arranged with the finger electrodes of the first comb electrode interdigitating with the finger electrodes of the second comb electrode in a predetermined overlap length weighting fashion for forming therein an overlap region and non-overlap region; and
    a dummy electrode insulated from said first and second comb electrodes and formed on said one surface of said substrate adjacent thereto in said non-overlap region, said dummy electrode comprising non-interdigitating fingers and being substantially at ground potential.

2. An elastic surface wave device according to claim 1, wherein said dummy electrode is associated with the first comb electrode which is connected to a signal terminal.

3. An elastic surface wave device according to claim 1, wherein said dummy electrode is grounded and is associated with the first comb electrode, and wherein said transducer includes a second grounded dummy electrode associated with said second comb electrode.

4. An elastic surface wave device according to any of claims 1, 2 or 3, wherein all the finger electrodes of said first and second comb electrodes participate in the overlap arrangement according to said weighting fashion.

5. An elastic surface wave device according to claim 4, wherein said finger electrodes are of a split structure.

6. An elastic surface wave device comprising:
    a piezoelectric substrate;
    a first electromechanical transducer provided on one surface of said substrate;
    second and third transducers provided on opposite sides of the first transducer;
    said first transducer comprising first and second comb electrodes each having respective finger electrodes arranged with the finger electrodes of the first comb electrode interdigitating with the finger electrodes of the second comb electrode in a predetermined overlap-length weighting fashion for forming therein an overlap region and non-overlap region; and
    said first transducer being provided on a side thereof facing said second transducer with a first dummy electrode, on a side facing said third transducer with at least a second dummy electrode said first and second dummy electrodes insulated from said first and second comb electrodes and arranged on said one surface of said transducer adjacent thereto in said non-overlap region, said first and second dummy electrodes comprising non-interdigitating fingers and being at ground potential.

* * * * *